United States Patent
Lee et al.

(10) Patent No.: US 8,059,745 B2
(45) Date of Patent: Nov. 15, 2011

(54) SHARING LOGIC CIRCUITRY FOR A MAXIMUM LIKELIHOOD MIMO DECODER AND A VITERBI DECODER

(75) Inventors: Seok-Jun Lee, Allen, TX (US); Manish Goel, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 770 days.

(21) Appl. No.: 12/187,178

(22) Filed: Aug. 6, 2008

(65) Prior Publication Data
US 2010/0034321 A1 Feb. 11, 2010

(51) Int. Cl.
*H04B 7/02* (2006.01)
*H04L 1/02* (2006.01)

(52) U.S. Cl. ........ 375/267; 375/262; 375/316; 375/324; 375/340; 375/341

(58) Field of Classification Search ............... 375/262, 375/267, 316, 324, 340, 341
See application file for complete search history.

(56) References Cited

U.S. PATENT DOCUMENTS

| | | | |
|---|---|---|---|
| 4,763,328 A | | 8/1988 | Shimoda et al. |
| 5,579,304 A | * | 11/1996 | Sugimoto et al. ............ 370/342 |
| 5,867,531 A | * | 2/1999 | Shiino et al. ................. 375/262 |
| 6,104,766 A | | 8/2000 | Coker et al. |
| 7,248,637 B2 | | 7/2007 | Hwang et al. |
| 2004/0052315 A1 | * | 3/2004 | Thielecke et al. ............ 375/299 |
| 2005/0141644 A1 | | 6/2005 | Sadowsky |
| 2006/0146965 A1 | | 7/2006 | Kwun et al. |
| 2008/0095281 A1 | | 4/2008 | Hosur et al. |

FOREIGN PATENT DOCUMENTS

WO 2004004137 A2 1/2004

OTHER PUBLICATIONS

Ye et al., "MIMO-OFDM for Wireless Communications: Signal Detection with Enhanced Channel Estimation", Trans. on Comm., vol. 50, No. 9 (IEEE, Sep. 2002), pp. 1471-1477.
"DSP FPGA System Partitioning for MIMO-OFDMA Wireless Basestations", Ver. 1.0 (Altera, Oct. 2007).
Cerato et al., "Enabling VLSI Processing Blocks for MIMO-OFDM Communications", vol. 2008, Article ID 351962 (Hindawi Publishing Corporation, VLSI Design).

* cited by examiner

*Primary Examiner* — Ted Wang
(74) *Attorney, Agent, or Firm* — Steven A. Shaw; W. James Brady; Frederick J. Telecky, Jr.

(57) ABSTRACT

A receiver system for receiving and decoding modulated communications signals in a multiple-input, multiple-output (MIMO) environment, where the signals are modulated according to Orthogonal Frequency Division Modulation (OFDM). The receiver system includes shared decoder logic circuitry that executes a maximum-likelihood (ML) estimation algorithm in deriving the signals transmitted from the multiple transmitting antennae, as those signals were received over all of the receiving antennae. For a control channel portion of the data frame, the shared decoder logic circuitry applies Viterbi decoding to the transmitted datastreams estimated by the ML estimation algorithm. This sharing of decoder logic reduces the integrated circuit chip area, and also power dissipation, otherwise required in performing these complex decoding functions.

17 Claims, 10 Drawing Sheets

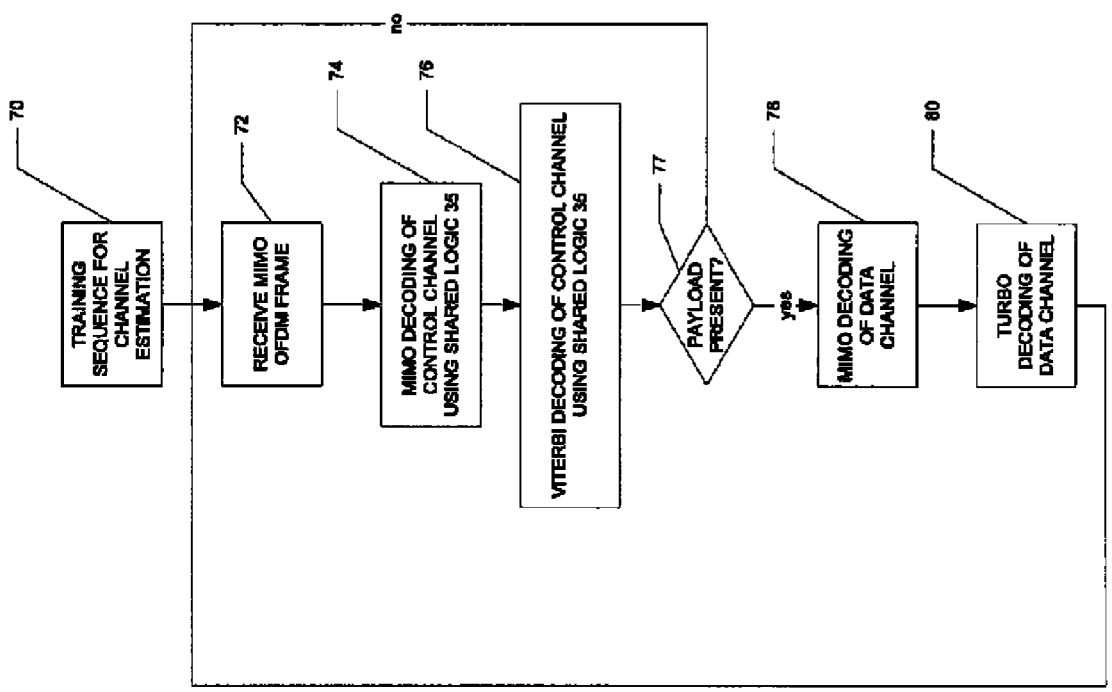

SHARING LOGIC CIRCUITRY FOR A MAXIMUM LIKELIHOOD MIMO DECODER AND A VITERBI DECODER

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of digital communications, and is more specifically directed to decoding digital signals received from wireless communications.

High-speed data communication services, for example in providing high-speed Internet access, have become a widespread utility for many businesses, schools, and homes. In its current stage of development, access to these services is available through an array of technologies. Recent advances in wireless communications technology have enabled localized wireless network connectivity according to the IEEE 802.11 standard to become popular for connecting computer workstations and portable computers to a local area network (LAN), and typically through the LAN to the Internet. Broadband wireless data communication technologies, for example those technologies referred to as "WiMAX" and "WiBro", and those technologies according to the IEEE 802.16d/e standards, have also been developed to provide wireless DSL-like connectivity in the Metro Area Network (MAN) and Wide Area Network (WAN) context. In addition, the communications specifications resulting from the "LTE" (Long Term Evolution) project of the Third Generation Partnership Project (3GPP), which set out to improve the UMTS mobile phone standard, also promise to provide broadband data communication on a wide-area basis.

Multiple-input-multiple-output (MIMO) communication techniques have recently attracted attention, especially in the wireless network context. In a general sense, MIMO communications are realized by providing multiple signal paths between a transmitter and a receiver. In this manner, the transmitted information is either redundantly or independently transmitted as multiple spatial streams between a transmitter antennae and receiver antennae, with the multiple spatial streams combined at the receiver. The spatial diversity provided by the MIMO approach provides improved data rates for a given bit error rate in the signal. These improvements are attractive in any wireless communications context, including wireless LAN/MAN/WAN communications, and wireless telephony. An overview of MIMO technology is provided in Gesbert et al., "From Theory to Practice: An Overview of MIMO Space-Time Coded Wireless Systems", *Journal on Selected Areas in Communications*, Vol. 21, No. 3 (IEEE, April 2003), pp. 281-302.

In the wireless network context, particularly in connection with the WiMAX and LTE standards, MIMO communication technology is being investigated for use in conjunction with orthogonal frequency-division multiplexing (OFDM) techniques. As known in the art, OFDM refers to a broadband communications approach in which modulated signals are transmitted over multiple narrow-bandwidth (e.g., 20 kHz) channels. The combination of MIMO and OFDM technologies is contemplated to provide excellent performance in the stringent environment of high data-rate wireless communications.

However, this combination complicates the decoding involved in order to correctly receive digital data over MIMO OFDM communications. In order to secure the MIMO wireless communications link, a MIMO decoder is necessary to resolve the incoming signal received at multiple antennae, at varying delay time. This MIMO decoder is typically realized as a maximum-likelihood ("ML") decoder, operating at high speed and high throughput in order to provide the desired high data rate performance. Demodulation of the OFDM datastream from its multiple sub-channels requires a Fast Fourier Transform function. And because the communicated data is encoded for purposes of forward error correction, yet another decoder function is necessary at the output of the MIMO OFDM receiver. Indeed, multiple error correction decoders must be made available for the various components of the communicated datastream.

FIG. 1 illustrates the overall functional architecture of a conventional MIMO OFDM receiver system, in the example of a two-antenna system (two transmitting antennae ATX1, ATX2, and two receiving antennae ARX1, ARX2). As known in the art, conventional MIMO OFDM network devices communicate bidirectionally. For clarity of this description, only the receiver side of such a device is shown in FIG. 1; those skilled in the art will readily comprehend the manner in which duplexed transmission is realized in modern wireless communications devices.

In the example of FIG. 1, receiver system 2 includes separate "front end" circuit functions 41, 42, each including an analog front end (AFE) and a digital front end (DFE), coupled to respective receive antennae ARX1, ARX2. As well-known in the art, front ends 4 include the desired and appropriate analog and digital filtering, analog-to-digital conversion, etc. typical for OFDM receivers. Receiver system 2 also includes Fast Fourier Transform (FFT) functions $6_1$, $6_2$, each connected to a corresponding front end $4_1$, $4_2$, respectively. FFT functions 6 each demodulate the received OFDM signal. As fundamental in the art, OFDM signals are modulated over multiple subcarrier frequencies, by way of the inverse Fourier transform of a block of a datastream. As such, FFT functions $6_1$, $6_2$ reverse the modulation for the signals received at their respective antenna ARX1, ARX2, transforming data from the time domain (as a datastream) into the frequency domain (amplitude and phase at each subcarrier frequency).

In conventional MIMO OFDM receiver system 2, the frequency-domain demodulated signals from FFT functions $6_1$, $6_2$ are applied to MIMO decoder 7, which analyzes the multiple received datastreams y and recovers the transmitted signal x therefrom. As fundamental in the art, recovery of signals $x_1$, $x_2$ that are transmitted over two respective antennae, from signals $y_1$, $y_2$ received over two antennae involves the solution of a system such as:

$$\begin{bmatrix} y_1 \\ y_2 \end{bmatrix} = \begin{bmatrix} h_{11} & h_{12} \\ h_{21} & h_{22} \end{bmatrix} \begin{bmatrix} x_1 \\ x_2 \end{bmatrix} + \begin{bmatrix} n_1 \\ n_2 \end{bmatrix}$$

where the $h_{ij}$ matrix members refer to the transfer function from the $j^{th}$ transmit antenna to the $i^{th}$ receive antenna, as shown in FIG. 1 (e.g., transfer function $h_{12}$ is the transfer function between transmit antenna ATX2 and receive antenna ARX1). Noise received at the $i^{th}$ receive antenna is represented by $n_i$. According to this conventional example, channel estimation function 7 estimates the various transfer functions and received noise, typically from known training signals demodulated by FFT functions 6 during initialization of the link, and communicates transfer matrix estimate $\hat{h}$ and channel noise estimates $\hat{n}_1$, $\hat{n}_2$ to MIMO decoder 8. MIMO decoder 8 in return produces datastream estimates $\hat{x}_1$, $\hat{x}_2$, which are estimates of the signals transmitted at antennae ATX1, ATX2, respectively, accounting for channel distortion and noise. Typically, MIMO decoder 8 is realized by way of a maximum-likelihood (ML) decoder, applied to both datastreams.

Following MIMO decoder 8, the datastream estimates $\hat{x}_1$, $\hat{x}_2$ are communicated to forward error correction function 10, which applies the appropriate error correction decoding to each datastream to recover the digital values of the information that was originally transmitted. As known in the art for WiMAX and LTE communications and as shown in FIG. 2, a communications link typically communicates data in frames, each frame containing a control channel 15 and a data channel 17. The contents of the control channel (15) within a frame indicate whether live data is present in the corresponding data channel (17) of that frame; as such, the validity of the signals in the data channel is dependent on the content of the control channel for that frame. According to conventional MIMO OFDM communications under the WiMAX and LTE standards, as well as others, data channel 17 and control channel 15 of each received frame are encoded differently, and are thus decoded separately. For example, a Viterbi decoder is required to decode the control information communicated in control channel 15 of the link. One or more additional decoders (e.g., "turbo" decoders, low density parity check (LDPC) decoders) are also typically required in order to decode data channel 17 in each MIMO OFDM frame. As such, in the Example of FIG. 1, forward error correction function 10 includes both turbo decoder logic circuitry 12, and also Viterbi decoder logic circuitry 14. The output from forward error correction function 10 is then applied to media access control (MAC) circuitry and functionality, as well known in the art.

As is well known in the art, each of these various multiple decoding functions involves complex logic functions and circuitry. A substantial number of logic gates and functions, and thus substantial integrated circuit "chip area", are necessary to realize these functions, especially as data rates increase. However, the power and chip area requirements of the end systems (e.g., mobile phone handsets, laptop computer wireless access cards) into which these functions are to be implemented are also becoming more stringent. In short, the operational requirements for modern high data rate communications are becoming more complicated, while the chip area and power consumption constraints of the circuitry carrying out those functions are becoming more stringent.

BRIEF SUMMARY OF THE INVENTION

It is therefore an object of this invention to provide circuitry and a method for reducing the circuit cost and complexity for MIMO and Viterbi decoding in the receipt of wireless digital MIMO communications.

It is a further object of this invention to provide such circuitry and method in a manner that does not adversely affect the throughput or fidelity of the data being communicated.

It is a further object of this invention to provide such circuitry and method that is scalable with the sizes and numbers of states of the decoders to be implemented.

Other objects and advantages of this invention will be apparent to those of ordinary skill in the art having reference to the following specification together with its drawings.

This invention may be implemented into circuitry and methods of operating circuitry in a Multiple-Input, Multiple-Output (MIMO) receiver receiving coded communications signals that, at least in part, are to be decoded by way of a Viterbi decoder. Circuitry used in MIMO decoding of demodulated signals from multiple receive antennae is also used in the Viterbi decoding of those decoded signals.

BRIEF DESCRIPTION OF THE SEVERAL VIEWS OF THE DRAWING

FIG. 10 is a flow diagram illustrating the operation of the receiver of FIG. 3, according to the preferred embodiment of the invention.

DETAILED DESCRIPTION OF THE INVENTION

This invention will be described in connection with its preferred embodiment, namely as implemented into the receive path of a transceiver system in a multiple-input, multiple-output (MIMO) communications environment, in which the communicated signals are modulated according to orthogonal frequency division multiplexing (OFDM). This particular embodiment is described in this specification because it is contemplated that this invention will be particularly beneficial when used in such an application. However, it is contemplated that this invention can provide substantial benefit in other applications beyond MIMO OFDM decoding, particularly in those applications in which decoding using both maximum-likelihood (ML) estimation or similar tree search minimization techniques, and also Viterbi decoding or other trellis-based decoding. Accordingly, it is to be understood that the following description is provided by way of example only, and is not intended to limit the true scope of this invention as claimed.

Figure 3:
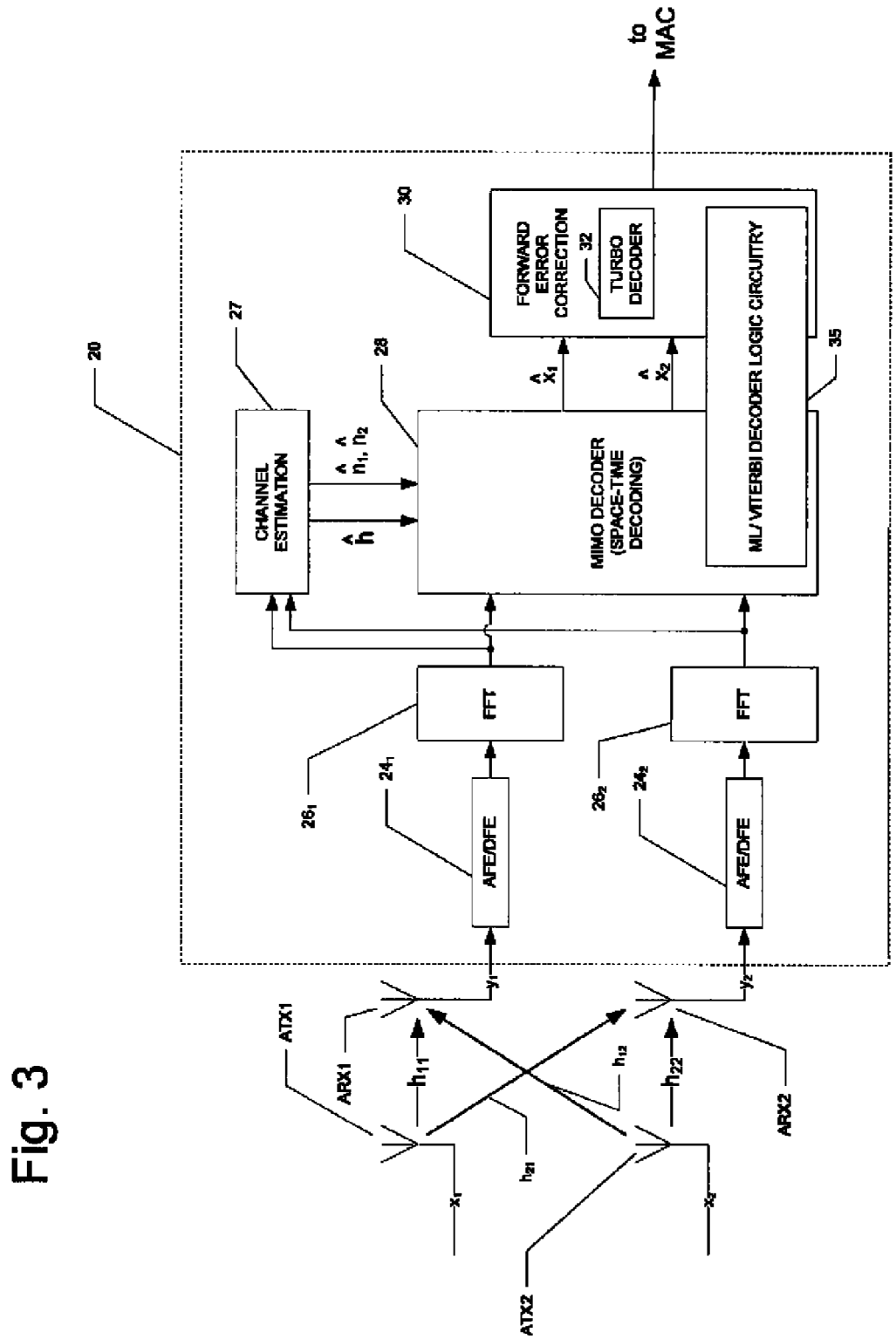
FIG. 3 is a functional diagram, in block form, of a MIMO OFDM receiver system according to the preferred embodiment of the invention.

FIG. 3 illustrates the functional arrangement of receiver system 20 for the example of receiving and decoding MIMO OFDM communications. As known in the art, MIMO technology has proven useful in providing high data rate communications, because the spatial diversity of the multiple signal paths provides additional data rate for a given signal-to-noise ratio of a wireless link. In addition, OFDM modulation has proven to increase the robustness of the transmissions over severe and varying channel conditions.

It is contemplated that receiver 20 will typically be implemented within a wireless network device that both receives and transmits OFDM-modulated communications over multiple antennae. For clarity of this description, only the receiver side of such a device is shown in FIG. 3; those skilled in the art will readily comprehend the manner in which duplexed transmission is realized in modern wireless communications devices. In addition, it is contemplated that receiver 20 will be realized within a larger scale system, including additional processing capability such as a media access controller (MAC), baseband digital processing, and the like. Indeed, it is contemplated that, in some instances, receiver system 20 will be implemented integrally within a complete end user system, within which input and output functions (display, keypad, etc.) as well as general purpose processing capability will also be realized.

FIG. 3 illustrates the relatively simple example of a two-antenna MIMO system, in which two receiving antennae ARX1, ARX2 receive communications from two transmitting antennae ATX1, ATX2. Of course, as known in the art, MIMO devices may utilize more than two antennae, both for transmission and for receipt. In general, a receiving system having M receive antennae is capable of receiving and resolving communications transmitted to it from a transmitter having N separate transmit antennae, where $N \leq M$. It is contemplated that those skilled in the art having reference to this specification will be readily able to implement this invention in connection with MIMO receivers having more than two receive antennae.

In the example of FIG. 3, as in conventional MIMO OFDM and other receiver systems, receiver 20 includes "front end" circuit functions $24_1$, $24_2$ that each process signals received from a respective receive antenna ARX1, ARX2. Front ends $24_1$, $24_2$ each include analog functionality, by way of an analog front end (AFE), analog-to-digital conversion functionality, and also digital functionality, by way of a digital front end (DFE). Front ends $24_1$, $24_2$ apply the desired and appropriate analog and digital filtering and other signal processing as typical for OFDM receivers. Fast Fourier Transform (FFT) functions $26_1$, $26_2$ each demodulate the received OFDM signal presented thereto by a respective one of front ends $24_1$, $24_2$. The demodulation applied by FFT functions $26_1$, $26_2$ recovers a time-domain datastream corresponding to the OFDM signal that is transmitted over multiple subcarrier frequencies, as well known in the art.

According to the preferred embodiment of the invention, the demodulated signals from FFT functions $26_1$, $26_2$ are applied to MIMO decoder 27. MIMO decoder 27 generates estimates of the two signals $x_1$, $x_2$ that were originally transmitted from the two transmitting antennae ATX1, ATX2, from the signals received at the two receive antennae ARX1, ARX2, considering that each receive antenna will receive a signal component from both of the transmitting antennae. In general, as discussed above, the signals $y_1$, $y_2$ received at the two receive antennae ARX1, ARX2 are the result of a linear system:

$$\begin{bmatrix} y_1 \\ y_2 \end{bmatrix} = \begin{bmatrix} h_{11} & h_{12} \\ h_{21} & h_{22} \end{bmatrix} \begin{bmatrix} x_1 \\ x_2 \end{bmatrix} + \begin{bmatrix} n_1 \\ n_2 \end{bmatrix}$$

where the $h_{ij}$ matrix members refer to the transfer function from the $j^{th}$ transmit antenna to the $i^{th}$ receive antenna, and where noise received at the $i^{th}$ receive antenna is represented by $n_i$. In this example as in conventional receivers, channel estimation function 27 drives an estimate of the transfer functions and of received noise from training signals received and demodulated by FFT functions 26. The transfer functions and noise estimates are communicated by channel estimation function 27 to MIMO decoder 28 as transfer matrix estimate $\hat{h}$ and channel noise estimates $\hat{n}_1$, $\hat{n}_2$ MIMO decoder 28 in return produces datastream estimates $\hat{x}_1$, $\hat{x}_2$, which are estimates of the signals transmitted at antennae ATX1, ATX2, respectively, accounting for channel distortion and noise.

Figure 1:
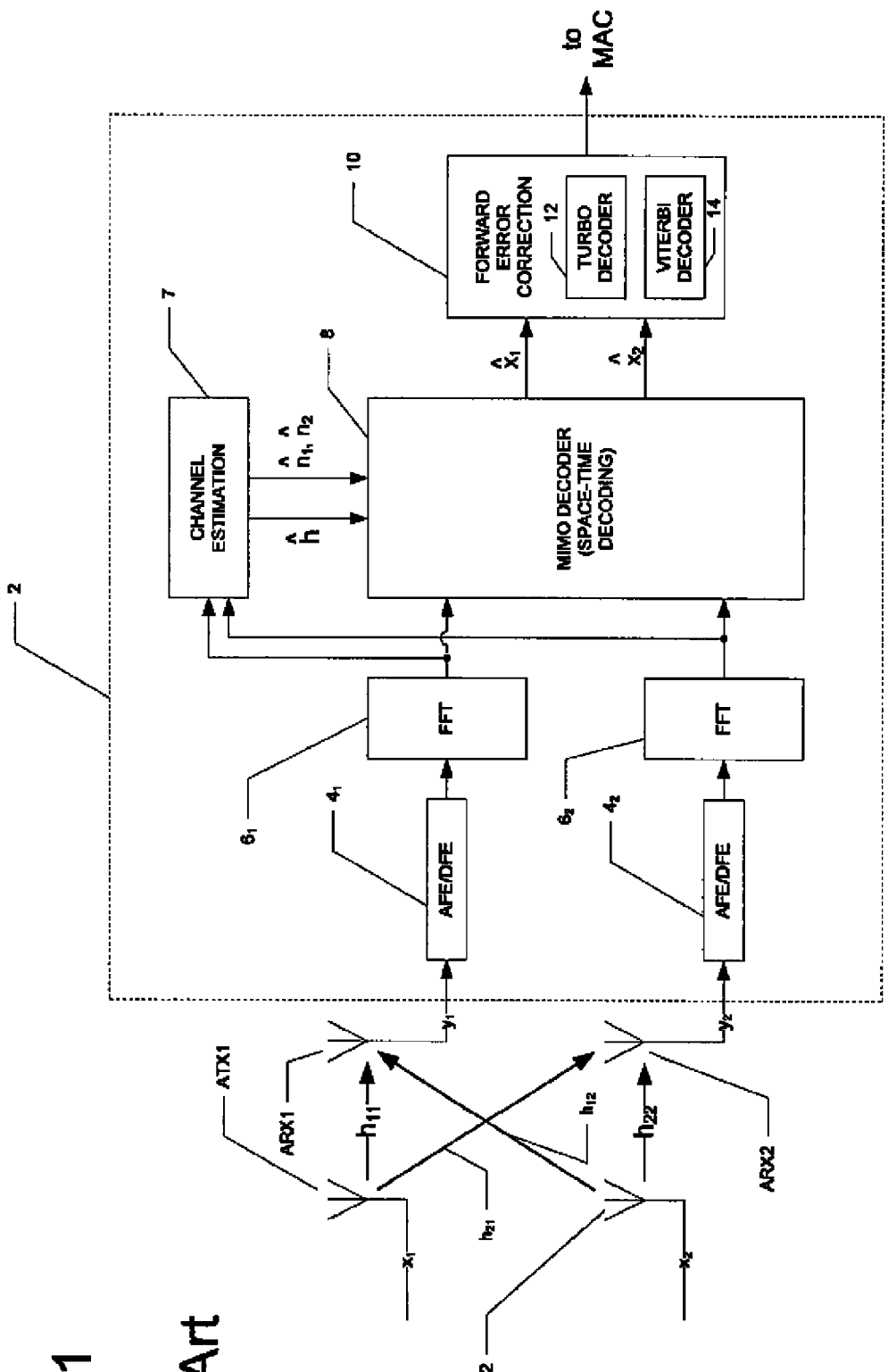
FIG. 1 is a functional diagram, in block form, of a conventional MIMO OFDM receiver system.
Figure 2:
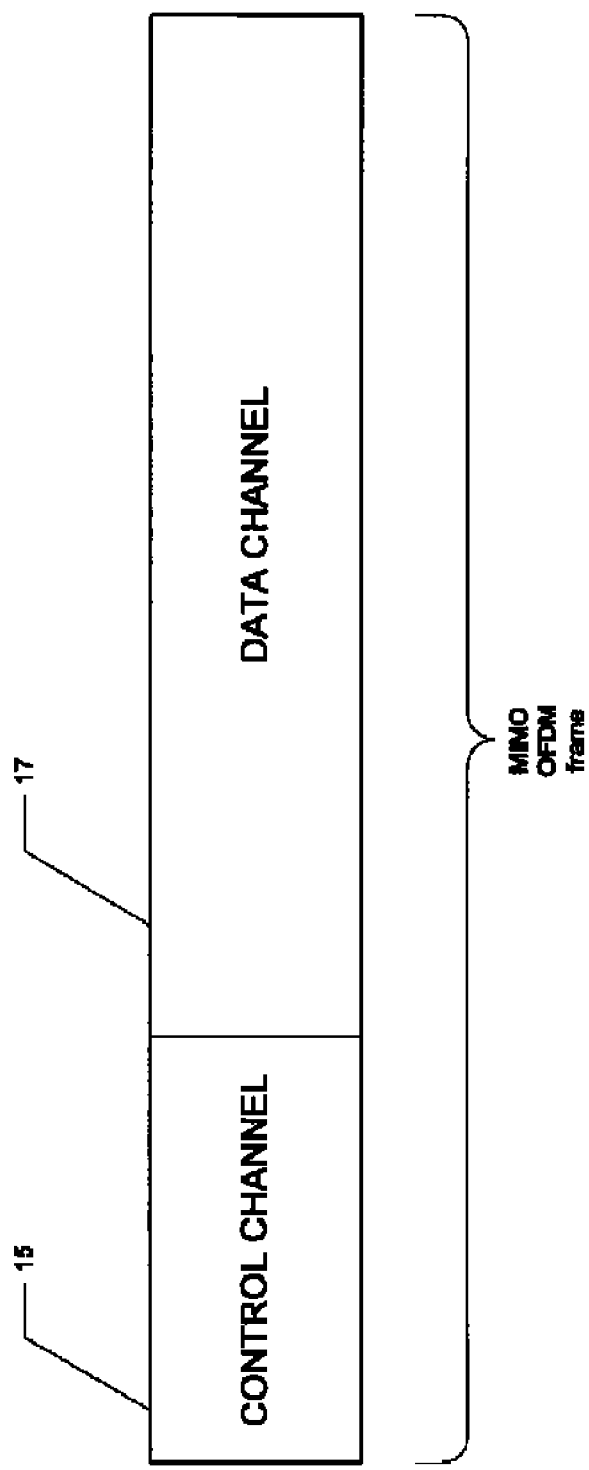
FIG. 2 is a diagram illustrating the construction of a conventional MIMO OFDM data frame.

In receiver 20 of FIG. 3, the datastream estimates $\hat{x}_1$, $\hat{x}_2$ are communicated to forward error correction function 30, which applies the appropriate error correction decoding to each datastream to recover the digital values of the information that was originally transmitted. According to this embodiment of the invention, as applied to MIMO OFDM communications under the WiMAX and LTE standards, the data channel and control channel of each transmitted frame (see FIG. 2) have been encoded differently prior to transmission, and are thus decoded separately upon receipt. In this example, turbo decoder 32 in forward error correction function 30 decodes the data channel of the OFDM frame, while the control channel of the frame is decoded by way of Viterbi decoding, as will be described in further detail below. The output from forward error correction function 30 is then forwarded to other circuitry in the overall system, such as a media access control (MAC) function.

According to the preferred embodiment of this invention, decoder logic circuitry 35 is shared between MIMO decoder function 28 and forward error correction function 30. This sharing results from the discovery, made in connection with this invention, that Viterbi decoding of the control channel within a received MIMO OFDM frame is performed during such time as MIMO decoder 28 is idle, and that MIMO decoder 28 operates during such time as Viterbi decoding of the control channel is not being performed. This temporal alternating of these two functions is due to the dependence of data channel MIMO decoding on the content of the control channel of that frame. As is apparent from the description above, MIMO decoding of received signals by MIMO decoder 28 is carried out for the control channel prior to the Viterbi decoding of that control channel. But MIMO decoding of the data channel is not performed until after Viterbi decoding of the control channel indicates that the data channel contains live data. This is because the contents of the control channel for a given MIMO OFDM frame may indicate that the data channel is empty. As such, receiver 20 according to this embodiment of the invention does not carry out MIMO decoding of a data channel in a given frame until the Viterbi decoding of the corresponding control channel is complete; the incoming data channel bits are simply buffered until the control channel information is interpreted. Conversely, Viterbi decoding is not applied to the data channel of MIMO OFDM frames according to the current operative technology; rather, turbo or LDPC decoding is applied to payload data. Because of this operation of conventional MIMO OFDM receivers, it has been discovered, according to this invention, that Viterbi decoding is not performed during such time as MIMO decoder 28 is operating.

According to another discovery made in connection with this invention, maximum-likelihood (ML) estimation decoding, as performed by MIMO decoder 28, and Viterbi decoding involve computations and operations that are very similar to one another.

As a result of these discoveries that ML decoding and Viterbi decoding involve similar computations and are not performed at the same time, the preferred embodiment of the invention incorporates shared logic circuitry 35 that is capable of performing operations involved in ML MIMO decoding and also Viterbi decoding. In effect, this shared circuitry 35 is included in both MIMO decoder function 28 and forward error correction function 30 in receiver 20. Because both of these decoding functions are quite complex, and involve substantial numbers of logic gates and interconnections, the sharing of logic circuitry between ML and Viterbi decoding according to this invention is contemplated to save substantial integrated circuit chip area, and also to substantially reduce power dissipation.

Figure 4:
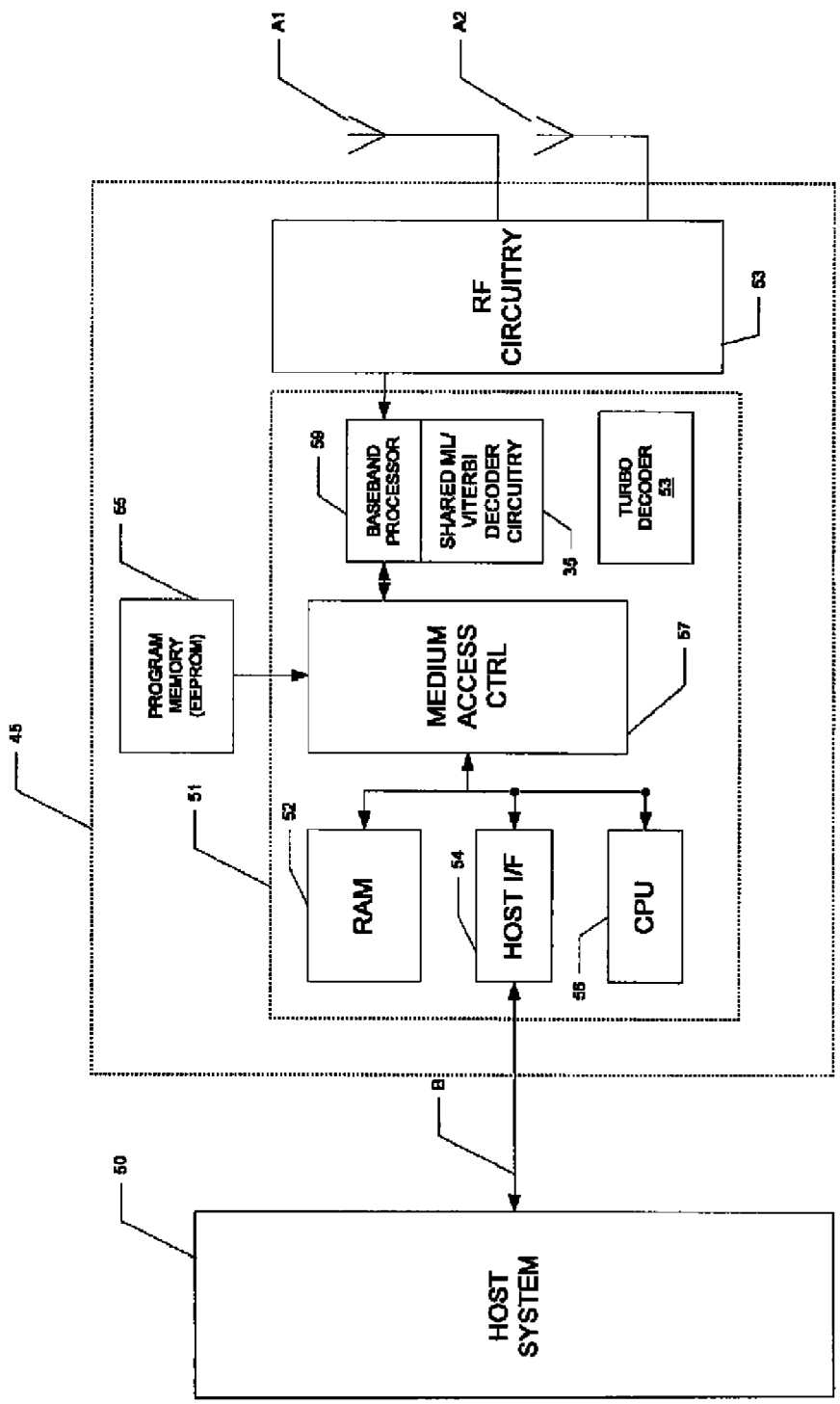
FIG. 4 is an electrical diagram, in block form, of the construction of an implementation of the MIMO OFDM receiver system of FIG. 3, according to the preferred embodiment of the invention.

FIG. 4 illustrates an example of the construction of a transceiver system constructed according to the preferred embodiment of the invention, in the form of a wireless broadband network adapter. Of course, it is contemplated that other architectures and approaches to realizing this transceiver system may also be used, as will be apparent to those skilled in the art having reference to this specification. Transceiver 45 according to this embodiment of the invention, illustrated in FIG. 4, includes the circuitry and functionality necessary and appropriate for carrying out the functions of receiver 20 described above relative to FIG. 3, according to this preferred embodiment of the invention, and also such additional functions including further processing of the received data and also transmission of signals in the reverse direction, as will now be described.

In FIG. 4, transceiver 45 is coupled to host system 50 by way of a corresponding bus B. Host system 50 corresponds to a personal computer, a laptop computer, or any sort of computing device capable of wireless broadband communications, in the context of a wireless local area network ("LAN"), wide area network (WAN), or "metro" area network ("MAN"); of course, the particulars of host system 50 will vary with the particular application. In the example of FIG. 3, transceiver 45 may correspond to a built-in broadband wireless adapter that is physically realized within its corresponding host system 50, to an adapter card installable within host system 50, or to an external card or adapter coupled to host computer 50. The particular protocol and physical arrangement of bus B will, of course, depend upon the form factor and specific realization of transceiver 45. Examples of suitable buses for bus B include PCI, MiniPCI, USB, CardBus, and the like.

Transceiver 45 in this example includes modem processor 51, which is bidirectionally coupled to bus B on one side, and to radio frequency (RF) circuitry 53 on its other side. RF circuitry 53, which may be realized by conventional RF circuitry known in the art, performs the analog demodulation, amplification, and filtering of RF signals received over the wireless channel and the analog modulation, amplification, and filtering of RF signals to be transmitted by transceiver 45 over the wireless channel, both via multiple antennae A1 and A2 in this MIMO context. As such, RF circuitry 53 includes front end functions $24_1$, $24_2$ of FIG. 3 described above. The architecture of modem processor 51 into which this embodiment of the invention can be implemented follows that of a conventional single-chip media access controller (MAC) and a baseband processor. It is contemplated that the architecture of other transceiver installations, including for wireless broadband communications, whether on the network or client side, can follow a similar generic approach, as modified for the particular application location, as known in the art. This exemplary architecture includes embedded central processing unit (CPU) 56, for example realized as a reduced instruction set (RISC) processor, for managing high level control functions within modem processor 51. For example, embedded CPU 56 manages host interface 54 to directly support the appropriate physical interface to bus B and host system 50. Local RAM 52 is available to embedded CPU 56 and other functions in modem processor 51 for code execution and data buffering. Medium access controller (MAC) 57 and baseband processor 59 are also implemented within modem processor 51 according to the preferred embodiments of the invention, for generating the appropriate packets for wireless communication, and providing encryption, decryption, and wired equivalent privacy (WEP) functionality. In this regard, baseband processor 59 carries out such functions as FFT functions 26, channel estimation function 27, and a portion of MIMO decoder 28, all shown in FIG. 3, as well as overall control of these functions. In this regard, it is contemplated that baseband processor 59 may be realized by way of a digital signal processor (DSP) "core", for example having the computational capacity of a modern DSP integrated circuit such as one of the TMS320C64x family of digital signal processors available from Texas Instruments Incorporated. Program memory 55 is provided within transceiver 45, for example in the form of electrically erasable/programmable read-only memory (EEPROM), to store the sequences of operating instructions executable by modem processor 51, including control instructions for carrying out the decoding sequences according to the preferred embodiment of the invention, which will be described in further detail below. Also included within transceiver 45, in the form of a wireless adapter, are other typical support circuitry and functions that are not shown, but that are useful in connection with the particular operation of transceiver 45.

According to the preferred embodiment of the invention, shared ML/Viterbi decoder circuitry 35 is provided within modem processor 51. For example, ML/Viterbi decoder circuitry 35 may be configured as a co-processor function relative to baseband processor 59 or CPU 56. As discussed above relative to FIG. 3, the sharing of this circuitry 35 is based on the discovery that MIMO decoding is not performed at the same time as Viterbi decoding of the control channel in MIMO OFDM communications, such as carried out according to the WiMAX and LTE standards, and also based on the discovery that the computations involved in both ML decoding and Viterbi decoding are sufficiently common that much of the logic circuitry can be shared. Accordingly, modem processor 51 includes shared ML/Viterbi decoder circuitry 35 for performing both the ML MIMO decoding function, and also Viterbi decoding of the control channel. The particular construction of this shared logic will be described in further detail below.

In addition, as discussed above, additional decoder circuitry may also be provided in modem processor 51 according to this preferred embodiment of the invention. As shown in FIG. 4, turbo decoder circuit 53 is included in this example, for decoding the data channel of received MIMO OFDM frames. Alternatively, or in addition, LDPC decoding circuitry may be realized within modem processor 51.

As known in the art, maximum likelihood (ML) estimation is a useful technique in resolving the multiple datastreams $x_i$ transmitted from multiple antennae, from signals $y_j$ as received at multiple antennae, considering that each receiver antenna receives signals from each of the multiple transmitter antennae. As discussed above, a vector y of received signals relates to a vector x of transmitted signals by:

$$y=Hx+n$$

where H is the matrix of transfer functions among the transmitter and receiver antennae, and where n represents the vector of received noise. For a 2×2 MIMO system (i.e., two transmitter antennae and two receiver antennae), signals $y_1$, $y_2$ received at the two receiver antennae can be expressed in terms of the individual transmitted data streams $x_1$, $x_2$, transfer functions $h_{ij}$ between the $j^{th}$ transmit antenna and the $i^{th}$ receive antenna, and received noise $n_i$:

$$\begin{bmatrix} y_1 \\ y_2 \end{bmatrix} = \begin{bmatrix} h_{11} & h_{12} \\ h_{21} & h_{22} \end{bmatrix} \begin{bmatrix} x_1 \\ x_2 \end{bmatrix} + \begin{bmatrix} n_1 \\ n_2 \end{bmatrix}$$

To recover the transmitted datastreams data streams $x_1$, $x_2$ from received signals $y_1$, $y_2$, using estimates of the transfer functions and noise, one must solve this system for components $x_1$, $x_2$ by linear algebra techniques.

According to the well-known approach to ML MIMO decoding, for example as described in commonly assigned U.S. Patent Application Publication No. US 2008/0095281 A1, published Apr. 24, 2008, and incorporated herein by reference, ML estimation of the transmitted vector x of dimension M (M being the number of transmitter antennae) from a received vector y of dimension N (N being the number of receiver antennae) is based on the minimization:

$$\hat{x}=\arg\min|y-Hx|^2$$

where H is the transfer function matrix. The result $\hat{x}$ is that vector x that produces the minimum of the squared difference. A known approach to the solution of this problem, given the dimensionality of the vectors, involves the decomposition of transfer function matrix H into a triangular form. A preferred approach is the QR decomposition of transfer function matrix H into right triangular form (matrix R discussed below). After this decomposition, the minimization problem can be reformulated into a "tree" search, which facilitates the calculation of the minimization function for each vector combination, and the selection of the vector that renders the minimum error.

Figure 5:
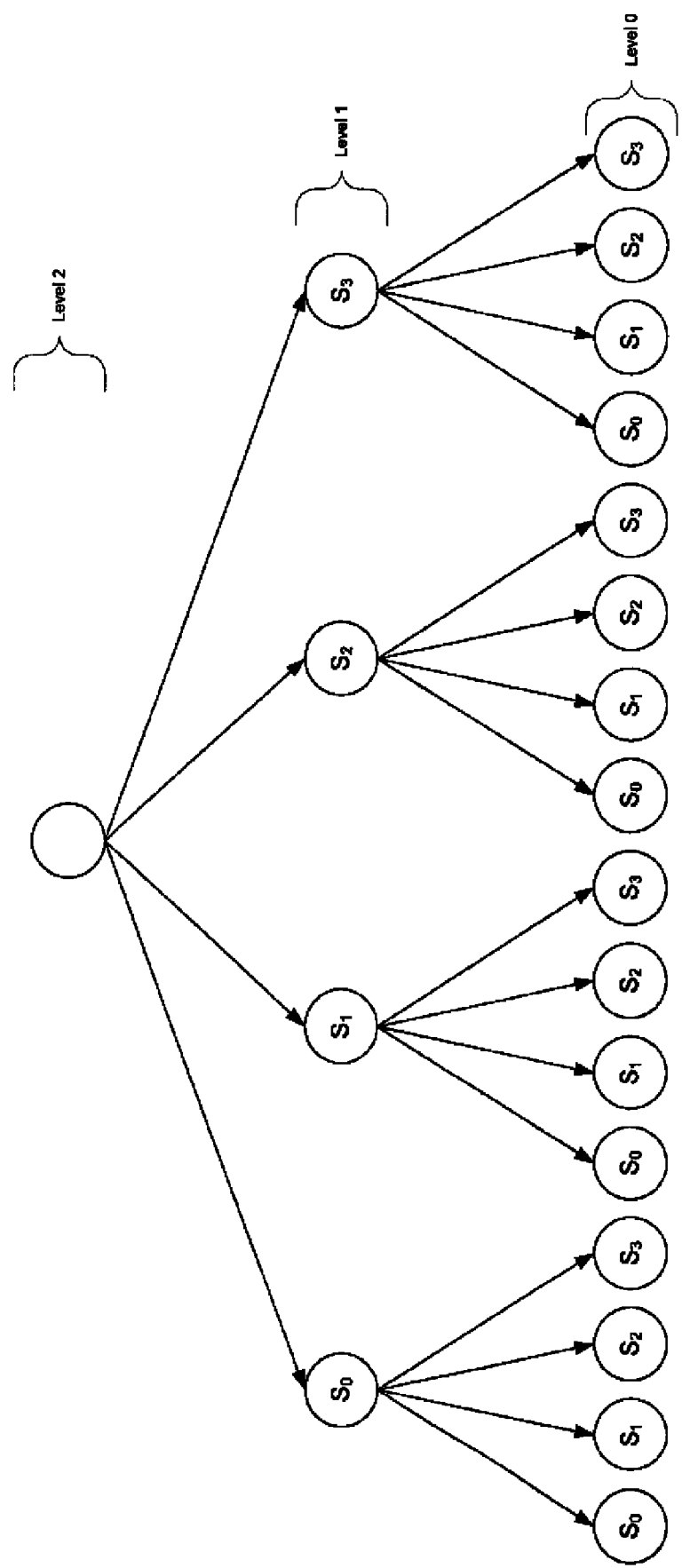
FIG. 5 is a tree diagram illustrating the operation of maximum likelihood (ML) estimation in MIMO decoding according to the preferred embodiment of the invention.

FIG. 5 illustrates a tree search for the example of decoding 2×2 MIMO signals modulated by QPSK. As known in the art, QPSK modulation (i.e., quadrature phase shift keying) applies a phase shift between successive symbols, with the available phase shifts in a four-point constellation of (1,1), (1,−1), (−1, −1), and (−1, 1) in the complex plane. As such, each transmitted symbol $x_i$ is represented by one of the constellation points, and can take one of four values. In 2×2 MIMO, therefore, each transmitted vector $x=(x_1, x_2)$ can take one of sixteen possible values.

The tree diagram of FIG. 5 considers each of the possible points of the QPSK constellation as corresponding to one of the states $S_0$ through $S_3$. Level 1 illustrates the branches selected based on one of these states $S_0$ through $S_3$ as assigned to symbol $x_2$ in transmitted vector x. Level 0 illustrates the lowest level branch ("leaf") indicating one of the states $S_0$ through $S_3$ assigned to symbol $x_1$ in transmitted vector x, given a state $S_0$ through $S_3$ assigned to symbol $x_2$ in that vector. In this 2×2 MIMO QPSK example, therefore, sixteen possible combinations of symbols are possible. Evaluation of each of these possible combinations involves a calculation of a distance D:

$$D=|y-Rx|^2$$

where vector $\tilde{y}$ is the received signal vector $$\begin{bmatrix} \tilde{y}_1 \\ \tilde{y}_2 \end{bmatrix}$$

after QR decomposition, where vector x is the transmitted signal vector $$\begin{bmatrix} x_1 \\ x_2 \end{bmatrix}$$

being evaluated, and where matrix R is the right triangular matrix derived by QR decomposition of the transfer function matrix H as follows:

$$R = \begin{bmatrix} r_{11} & c_{12} \\ 0 & r_{22} \end{bmatrix}$$

as determined in the manner well-known in the art.

Other approaches to ML estimation also involve this distance D calculation. For example, as described in the above-incorporated U.S. patent application Publication, a "zero-forcing" approach can be used to limit the number of branches (i.e., leaves) in the tree search structure for which this calculation is to be made.

As evident from the foregoing description, the complexity of ML estimation and decoding depends on the complexity of the modulation scheme, as well as the number of receiver antennae. The number of "levels" of the tree structure depends on the number of receiver antennae. For example, if signals are received at three receiver antennae, then an additional level of branches will be present; in this case, the top (null) level of the tree diagram would be Level 3, with three levels of states underlying that top level. The number of points in the modulation constellation determines the number of possible states in each level. For example, if 64-QAM modulation is used, sixty-four possible states ($S_0$ through $S_{63}$) would be available for each symbol. In a 2×2 MIMO receiving 64-QAM modulated signals, Level 1 of the two-level tree diagram would have sixty-four states, and Level 0 would have 4096 possible states (sixty-four possible states for each of the sixty-four Level 1 states).

As noted above, it has been discovered, in connection with this invention, that the Viterbi decoding process involves computations that are quite similar to that involved in ML estimation. As is fundamental in the art, for example as described by Viterbi, "Error Bounds for Convolutional Codes and an Asymptotically Optimum Decoding Algorithm," *Transactions on Information Theory*, Volume IT-13, pp. 260-69 (IEEE, 1967), Viterbi decoding effectively calculates the "Hamming distance", or error distance, between the received symbol value at a given time in a sequence, and each of the possible symbol values that could have been received at that time. Each Hamming distance value for a transition to a state of the decoder is accumulated for that state, along with a "history" of the predecessor state from which that possible symbol value caused a transition. The process is repeated for the next state transition(s), until the code word has been processed (including any tail, or memory flushing, bits). A traceback process is then performed, beginning from the terminal state and following the path of smallest accumulated error metrics and associated predecessor states. The most likely transmitted bits can be identified from this traceback path, despite occasional errors caused by channel and noise effects.

Figure 6:
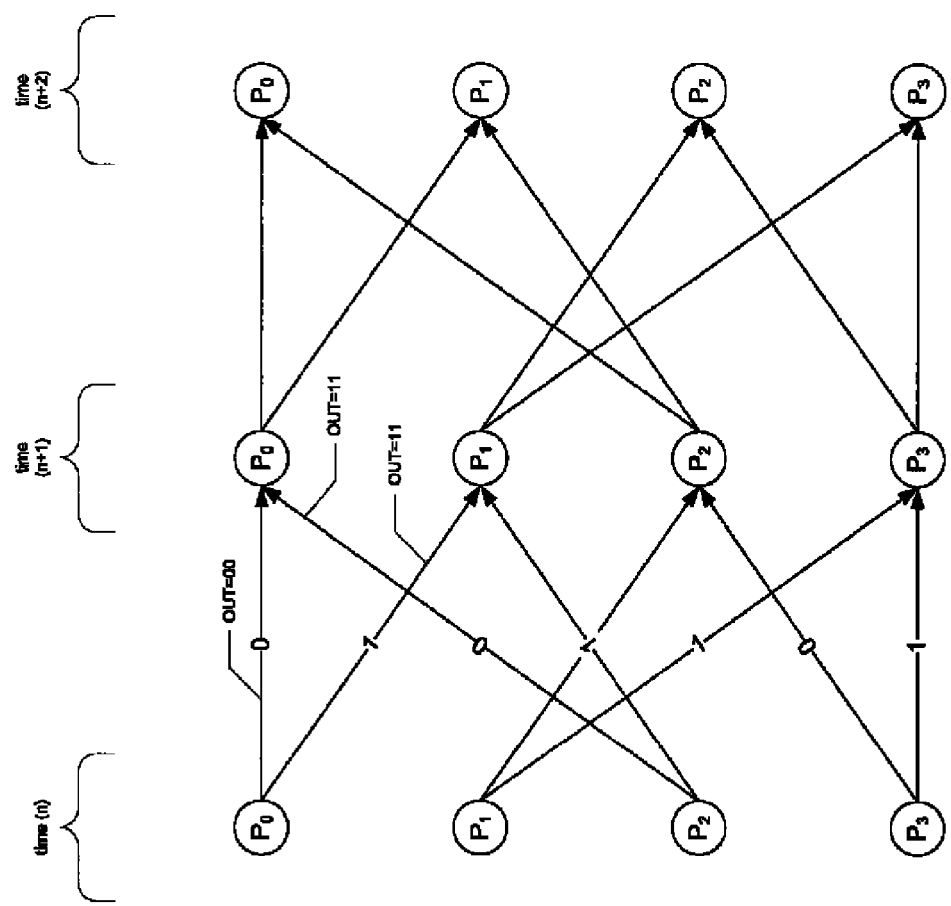
FIG. 6 is a trellis diagram illustrating the operation of Viterbi decoding of the control channel in MIMO OFDM frames according to the preferred embodiment of the invention.

FIG. 6 illustrates the well-known "trellis" diagram used in connection with Viterbi decoding. As discussed above, Viterbi decoding is essentially an exercise in deducing the input bits to the encoder from the most likely encoder output values, given the received symbol values. The diagram of FIG. 6 corresponds to four encoder states $P_0$ through $P_3$ at each point in time n, n+1 etc. These four states may constitute the entire trellis (for a code in which "constraint" K=3, the number of states is expressed by $2^{K-1}$), or may constitute only a portion of a larger trellis (i.e., corresponding to a code with a larger K). State transitions occur from one point in time (n) to the next (n+1), depending on the value of a next input data value (0 or 1). In this trellis of FIG. 6, if the encoder is in state $P_0$ at time n and the next input bit is a 0, the encoder will remain in state $P_0$ at time n+1; an input bit of 1 will cause a transition from state $P_0$ to state $P_1$. Other state transitions in this trellis are shown in FIG. 6; the particular transitions will, of course, depend on the code. In addition, each state transition has a corresponding encoder output, depending also on the particular code that is used. FIG. 6 illustrates two encoder output values corresponding to the state $P_0$ transitions from time n to time n+1, for the example of a ½ code rate (i.e., each input bit generates two output bits at the encoder). Each of the other state transitions is also associated with an encoder output value. It is these output values that are used in determination of Hamming distances as the branch metrics of state transitions, as accumulated into the overall state error metrics, as will now be discussed.

As is well known, and as summarized above, the Viterbi decoder problem is to identify, for a given encoder state at a given point in time, which of the possible state transitions to that state is most likely. From a computational standpoint, this determination is made by identifying the state transition with the minimum Hamming distance between the received symbol value r and the encoder output symbol value y corresponding to that state transition. Of course, the received symbol value r corresponds to the transmitted symbol value x plus noise n injected over the channel (i.e., r=x+n). In other words, over a set of possible state transition output symbol values y, the Viterbi decoding problem amounts to:

$$\arg\min |y-r|^2$$

In the trellis diagram of FIG. 6, this problem is illustrated at state $P_0$ at time n+1. Two possible transitions into that state are available: one transition is from state $P_0$ and has an output value of 00, and the other is from state $P_2$ and has an output value of 11. Viterbi decoding will compute the Hamming distance from the received symbol value r at time n+1 to each of these possible output values (00, 11), store the path giving the lowest Hamming distance as the predecessor state, and retain that lowest Hamming distance in the accumulated state error metric. This calculation is performed for each of the encoder states in the trellis.

Figure 7B:
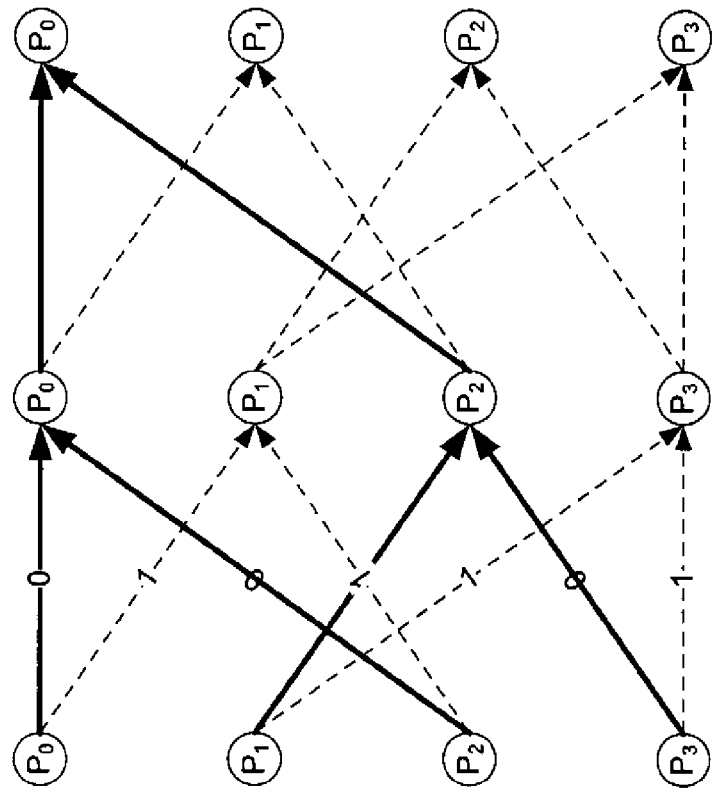
FIGS. 7a and 7b are tree and trellis diagrams, respectively, that illustrate the commonality of computational paths in ML estimation and Viterbi decoding according to the preferred embodiment of the invention.
Figure 7A:
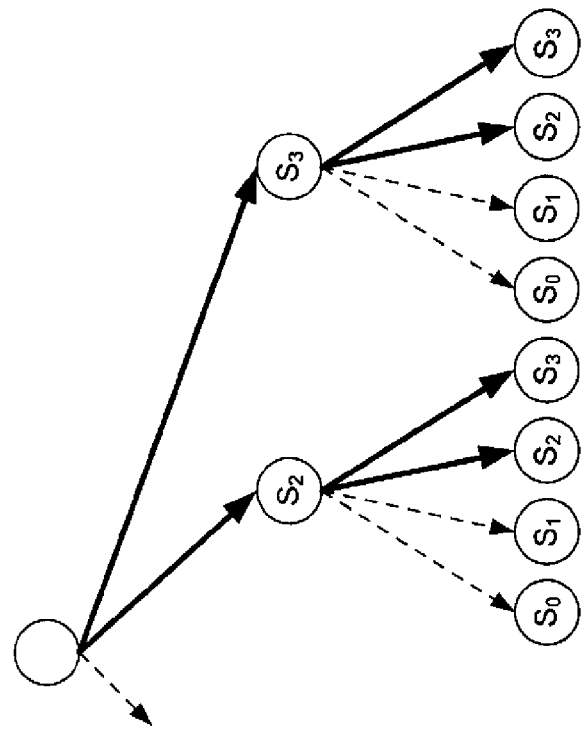

As evident from the foregoing discussion, similar calculations are involved in ML estimation and Viterbi decoding. FIGS. 7a and 7b illustrate an example of this commonality in the datapaths of the ML estimation and Viterbi decoding operations. In FIG. 7a, those tree calculations corresponding to the evaluation of the combinations of states $S_2$, $S_3$ corresponding to four possible received symbol combinations at the two receiver antennae ARX1, ARX2 are highlighted. Evaluation of those four leaves involves four evaluations of:

$$D=|\tilde{y}-Rx|^2$$

which, in expanded form involves the calculations of:

$$D(x_2=S_3,x_1=S_3)=(\tilde{y}_1-r_{11}S_3-c_{12}S_3)^2+(\tilde{y}_2-r_{22}S_3)^2$$

$$D(x_2=S_3,x_1=S_2)=(\tilde{y}_1-r_{11}S_2-c_{12}S_3)^2+(\tilde{y}_2-r_{22}S_3)^2$$

$$D(x_2=S_3,x_1=S_3)=(\tilde{y}_1-r_{11}S_2-c_{12}S_3)^2+(\tilde{y}_2-r_{22}S_2)^2$$

$$D(x_2=S_3,x_1=S_2)=(\tilde{y}_1-r_{11}S_3-c_{12}S_2)^2+(\tilde{y}_2-r_{22}S_3)^2$$

FIG. 7b highlights the branch metrics necessary to evaluate the accumulated path metrics (PM) of the four possible paths to state $P_0$ at time (n+2). These four paths also involve four calculations of branch metrics (BM), as follows:

$$PM(P_{0,n} \to P_{0,n+2}) = PM(P_{0,n}) + BM(P_{0,n} \to P_{0,n+2})$$

$$BM(P_{0,n} \to P_{0,n+2}) = (r_{n+1} - d(P_{0,n} \to P_{0,n+1}))^2 + (r_{n+2} - d(P_{0,n+1} \to P_{0,n+2}))^2$$

$$PM(P_{1,n} \to P_{0,n+2}) = PM(P_{1,n}) + BM(P_{1,n} \to P_{0,n+2})$$

$$BM(P_{1,n} \to P_{0,n+2}) = (r_{n,1} - d(P_{1,n} \to P_{2,n+1}))^2 + (P_{2,n+1} \to P_{0,n+2}))^2$$

$$PM(P_{2,n} \to P_{0,n+2}) = PM(P_{2,n}) + BM(P_{2,n} \to P_{0,n+2})$$

$$BM(P_{2,n} \to P_{0,n+2}) = (r_{n+1} - d(P_{2,n} \to P_{0,n+1}))^2 + (r_{n+2} - d(P_{0,n+1} \to P_{0,n+2}))^2$$

$$PM(P_{3,n} \to P_{0,n+2}) = PM(P_{3,n}) + BM(P_{3,n} \to P_{0,n+2})$$

$$BM(P_{3,n} \to P_{0,n+2}) = (r_{n+1} - d(P_{3,n} \to P_{2,n+1}))^2 + (r_{n,n+1} - d(P_{2,n+1} \to P_{2,n+2}))^2$$

where the path metric $PM(P_{0,n})$ is the accumulated path metric at state $P_0$ at time n, where the branch metric $BM(P_{0,n} \to P_{0,n+2})$ is the branch metric for the branch between state $P_0$ at time n and state $P_0$ at time n+2, where the function $d(P_{0,n} \to P_{0,n+1})$ refers to the encoder output for the state transition between state $P_0$ at time n and state $P_0$ at time n+1, and where $r_n+1$ is the received symbol value for the time interval between time n and time n+1. As evident from a comparison of FIGS. 7a and 7b, and of the calculations involved in each indicated above, both processes involve sums of squared differences. And as such, these sums of squared differences can be calculated by identical logic circuitry.

Figure 8:
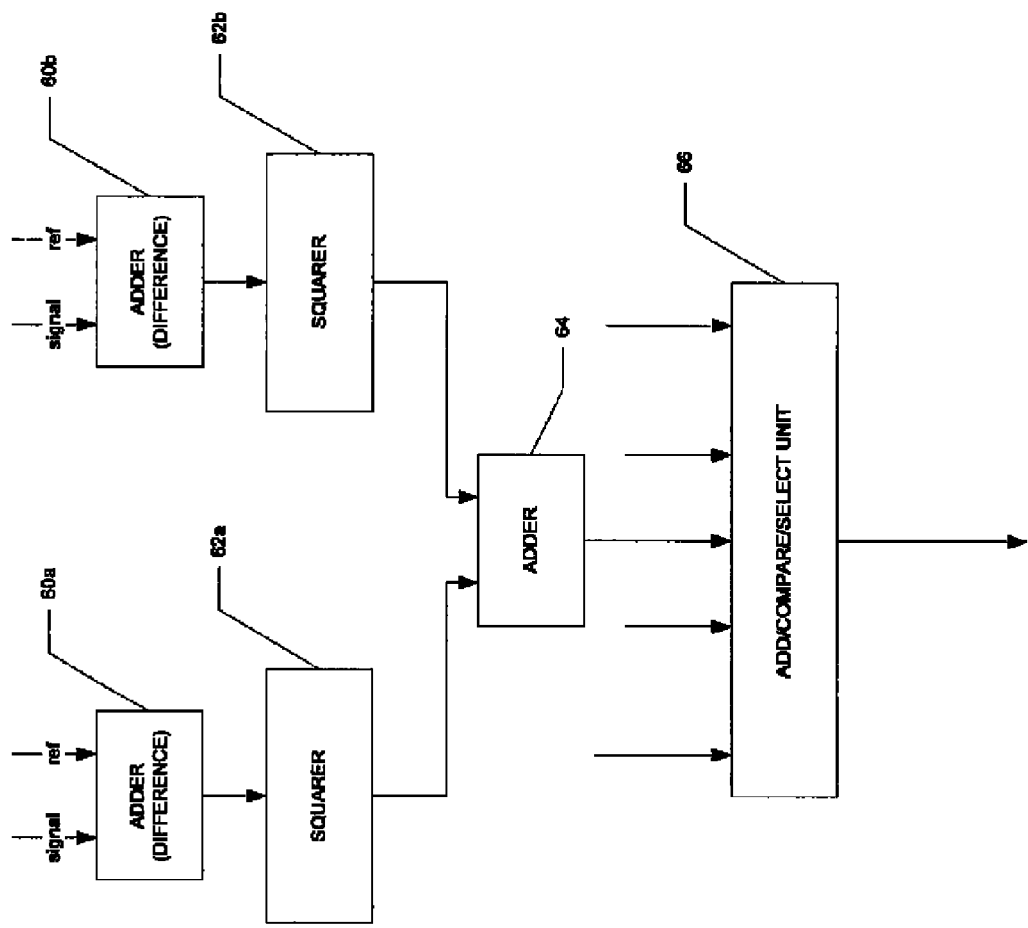
FIG. 8 is an electrical diagram, in block form, illustrating an example of the circuitry shared by the ML estimation and Viterbi decoding functions in the receiver of FIG. 3 according to the preferred embodiment of the invention.

FIG. 8 illustrates an example of logic functions that are shared in ML/Viterbi decoder logic circuitry 35. This particular example of FIG. 8 is provided merely for illustration, at a high logic level. Those skilled in the art will readily understand that the logic circuitry and functionality involved in carrying out the common calculations in ML estimation and Viterbi decoding as described above can be realized in myriad ways, depending on the desired approach to these calculations, on the manufacturing technology used, on the architecture of the overall receiver 20, and on other factors. As such, the example of FIG. 8 is not intended to be limiting in any way, but is provided merely as an illustrative example.

Adders 60a, 60b in the example of FIG. 8 each receive two inputs: one input corresponds to the received symbol value ("signal"), while the other corresponds to one of the true symbol values in the transmitted data ("ref"). Each of adders 60a, 60b produces an output corresponding to the difference between the values at its inputs, and forwards this difference to an input of a corresponding squarer 62a, 62b, respectively. Squarers 62a, 62b each produce an output value corresponding to the square of the difference input from its corresponding adder 60a, 60b. The outputs of squarers 62a, 62b are applied to inputs of adder 64, which generates a sum of the two squared values and forwards that sum to an input of add/compare/select unit 66. As such, the value at the output of adder 64 is the sum of two squared differences, consistent with the common calculations involved in ML estimation and Viterbi decoding as described above. Add/compare/select unit 66 is conventional circuitry for comparing and selecting an extreme value (in this example, the lowest input value) from its multiple inputs, and for accumulating that extreme value result over time or iterations, if desired for the particular operation.

The instance of the circuitry illustrated in FIG. 8 of course reflects one such sum-of-squared-differences. The number of instances of this or similar circuitry for carrying out these common calculations in ML estimation and Viterbi decoding will depend on the scale of the MIMO OFDM communications to be managed, as well as design choice regarding the extent to which such calculations are to be sequentially realized in carrying out the ML estimation or Viterbi decoding. In this regard, and referring back to FIGS. 7a and 7b, it is of course understood by those skilled in the art that the sharing of other couplings in ML estimation and Viterbi decoding can also be implemented. For example, in carrying out the ML tree and Viterbi trellis illustrated in FIGS. 5 and 6, respectively, four instances of the circuitry of FIG. 8 can support ML estimation and Viterbi decoding, for the four sets of shared couplings present in the diagrams of FIGS. 5 and 6. More specifically, the ML estimation paths highlighted in FIG. 7a cover one-fourth of the branches in the ML tree of FIG. 5. Similarly, the state transitions highlighted in FIG. 7b show the possible paths to state $P_0$ at time n+2 in FIG. 6; there are a total of four states $P_0$ through $P_3$ to be considered in this Viterbi decoder trellis, as evident from FIG. 6. Accordingly, considering that FIG. 8 illustrates a single sum-of-squared-differences calculation, thirty-two instances of the arrangement of FIG. 8 will be necessary to simultaneously derive the calculations involved in the tree and trellis of FIGS. 5 and 6, respectively.

Considering the commonality of calculations involved in ML estimation and Viterbi decoding, as discovered in connection with this invention, the parameters defining the ML estimation tree (FIG. 5) have a relationship to the parameters defining the Viterbi decoding trellis (FIG. 6). According to this preferred embodiment of the invention, the number of nodes in Level 1 of the ML search tree (FIG. 5), determines the maximum number of states in the Viterbi decoder to be supported by the shared decoder logic circuitry 35 if the Viterbi decoder is implemented in state-parallel manner. More specifically, the number $N_1$ of nodes in the first level of the ML tree below the top level (i.e., Level 1 of the ML tree of FIG. 5) establishes the maximum Viterbi constraint $K_{max}$ as follows:

$$N_1 = 2^{K_{max}-1}$$

The number $N_1$ of nodes in Level 1 of the ML tree depends on the number of points in the modulation constellation of the first symbol value considered (e.g., X2). For the example of QPSK, in which four points are present in the modulation constellation in the complex plane, $N_1=4$. This renders $K_{max}=3$. And, as well known in the Viterbi decoder art, a constraint value K=3 results in $2^{K-1}=4$ states at each point in time in the Viterbi trellis. Also according to this preferred embodiment of the invention, the number $N_2$ of nodes in the second level of the ML tree from the top level (i.e., Level 0 of the ML tree of FIG. 5), indicates the maximum radix (i.e., number of input nodes, and thus number of output nodes, that are processed together) supportable for the Viterbi decoder, as follows:

$$N_2 = 2^R$$

where R is the maximum radix supportable. This number $N_2$ of nodes in Level 0 corresponds to the total number of combinations of symbol values, and thus on the modulation for the second symbol value considered (e.g., $x_1$). In this embodiment of the invention, both of the symbol values are QPSK modulated (four point constellations). As such, the number of nodes in Level 0 of the ML tree of FIG. 5 is sixteen (four nodes for each of the four Level 1 nodes), in which case the maximum Viterbi decoder radix supportable is R=4.

Of course, if the particular MIMO decoding to be carried out by an instance of receiver 20 in a particular environment is substantially more or substantially less complex than the corresponding Viterbi decoding, shared decoder circuitry 35 will not be used to full efficiency in one or both of those decoding operations. For example, if the MIMO decoding is substantially more complex than the Viterbi decoder, either the MIMO decoding will require additional iterations through shared decoder logic circuitry 35, or the Viterbi decoding will not fully utilize the shared decoder logic circuitry 35 to decode the control channel of the received frame. It is therefore preferable, depending on the environment of course, to match the MIMO detection function with Viterbi decoding in complexity, according to the relationship discussed above.

Figure 9:
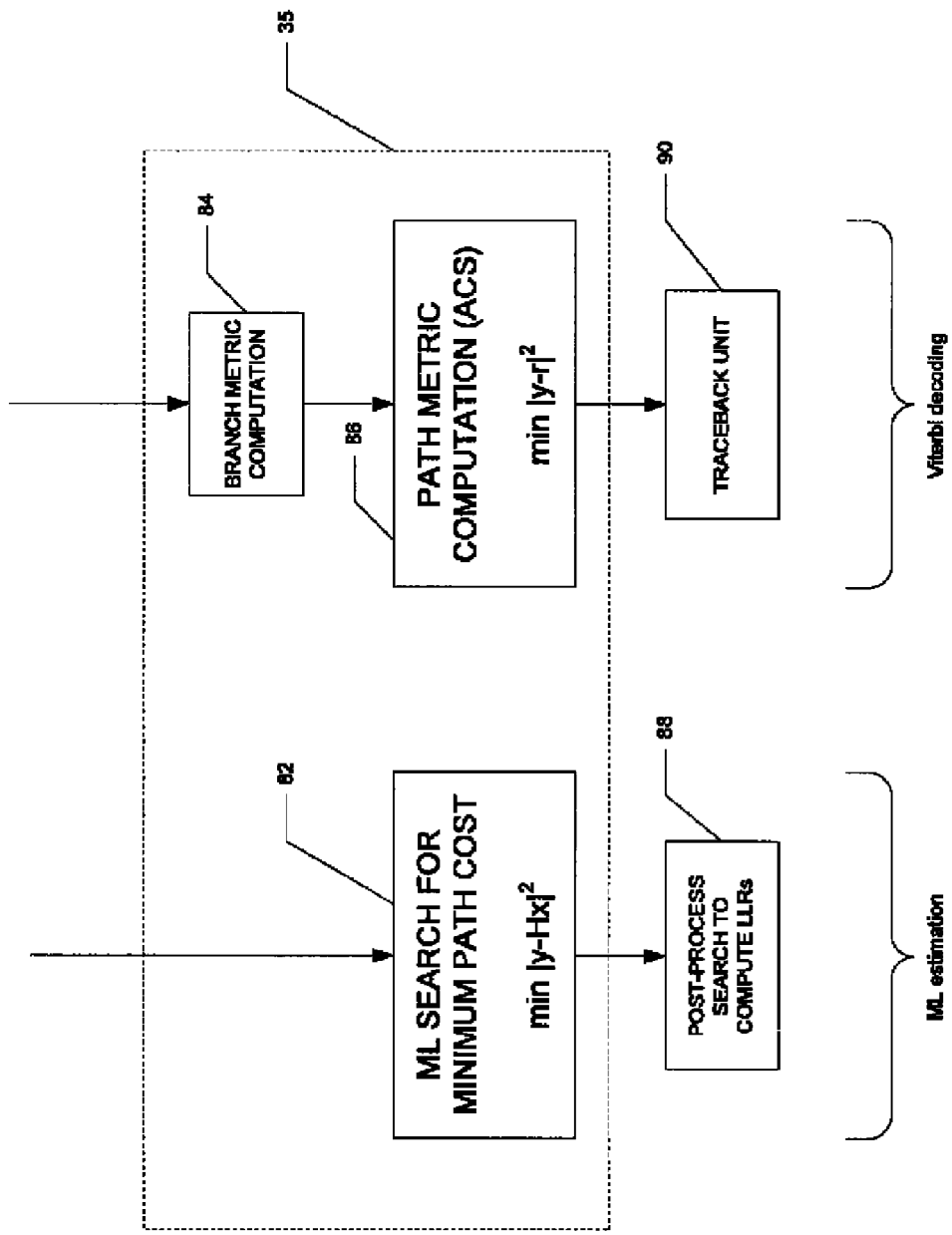
FIG. 9 is a functional diagram, in block form, illustrating the operations involved in ML estimation and Viterbi decoding that are shared, and those that are not shared, according to the preferred embodiment of the invention.

FIG. 9 illustrates, in higher level block diagram form, the operations in each of ML search for MIMO decoding and of Viterbi decoding. As shown in FIG. 9, shared ML/Viterbi decoder logic circuitry 35 carries out function 82 of ML search for minimum path cost, specifically by identifying the ML tree path with the minimum Hamming distance, as discussed above. Similarly, shared ML/Viterbi decoder logic circuitry 35 carries out function 84 of branch metric computation and function 86 of path metric computation (add/compare/select), both as used in Viterbi decoding. The ML estimation post-process function 88, in which log-likelihood-ratios (LLRs), and the Viterbi decoding traceback function 90, are carried out by logic circuitry separate from shared ML/Viterbi decoder logic circuitry 35, as indicated in FIG. 9.

The integrated circuit chip area savings attained by sharing logic circuitry between ML search and Viterbi decoding according to this preferred embodiment of the invention is contemplated to be substantial. By way of calculation and simulation in connection with an example of 2×2 64-QAM modulated MIMO OFDM signals, it has been determined that Viterbi decoding with a constraint K=7 (determined from the 64-QAM constellation as discussed above), and a ⅓ mother code rate, can be supported by the shared ML/Viterbi decoder logic circuitry 35, at a integrated circuit chip area saving of 35% relative to the chip area required if these functions were implemented separately.

Referring now to FIG. 3 in combination with FIG. 10, the operation of receiver 20 in receiving and decoding MIMO OFDM communications according to the preferred embodiment of the invention will now be described. Channel estimation function 27 establishes its estimates of the channel transfer functions and channel noise in the conventional manner in process 70, based on known training sequences communicated during an initialization sequence. In process 72, receiver 20 receives a frame of data. As discussed above relative to FIG. 2, according to this embodiment of the invention, each MIMO OFDM data frame includes control channel 15 and data channel 17. In connection with this MIMO environment, this data frame is received in process 72 at all of the receiver antennae ARX1, ARX2 (in this example). The appropriate filtering is applied to this data frame by front end functions 24, and the OFDM data frame is demodulated into the frequency domain by way of FFT functions 26.

The control channel 15 of the received and demodulated data frame is then decoded by shared ML/Viterbi decoder logic circuitry 35, in process 74. To the extent that the data channel 17 of the current frame has been received, that data may be buffered within receiver 20, either before or after filtering and demodulation. As described above, shared decoder logic circuitry 35 preferably applies ML estimation to the contents of control channel 15 to recover an estimate of the datastream as transmitted. Following MIMO decoding process 74, and such other post-MIMO detection processing, the contents of control channel 15 are then decoded according to the Viterbi algorithm in process 76, using shared ML/Viterbi decoder logic circuitry 35, in the manner described above. Shared ML/Viterbi decoder logic circuitry 35 is available for Viterbi decoding in process 76, as discussed above, because further MIMO decoding (i.e., of data channel 17) is not performed until after interpretation of control channel 15.

Following Viterbi decoding process 76, the recovered contents of control channel 15 are then interpreted, for example by MAC processor 57. If the interpreted contents of control channel 15 indicate that payload data is contained within data channel 17 of the current MIMO OFDM frame (decision 77 is YES), MIMO decoding of data channel 17 can then commence in process 78, again using shared ML/Viterbi decoder logic circuitry 35. In process 80, the datastreams recovered from MIMO decoding process 78 can then be decoded for purposes of forward error correction, for example by way of turbo decoding as discussed above. Receiver 20 is then ready to receive the next MIMO OFDM frame.

According to the preferred embodiment of the invention, shared ML/Viterbi decoder logic circuitry 35 is available for use during turbo decoding process 80, considering that turbo decoder logic 32 (FIG. 3) is not used during MIMO decoding. As such, MIMO decoding of the control channel 15 for the next data frame can begin even before turbo decoding of data channel 17 from the previous frame is complete.

According to the preferred embodiments of this invention, therefore, substantial integrated circuit chip area can be saved by utilizing shared logic circuitry for the two computationally-intensive operations of ML estimation for MIMO decoding, and the calculations involved in Viterbi decoding. This sharing of logic circuitry is enabled, according to this embodiment of the invention, without any deleterious effect on system performance in the MIMO OFDM environment, because of the realization that MIMO decoding is not being carried out during the Viterbi decoding of the control channel portion of the MIMO OFDM frame. Accordingly, the reduced cost and lower power consumption provided by the preferred embodiments of the invention is attained at little or no performance cost.

While this invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A receiver system for receiving and decoding modulated signals transmitted from a plurality of transmitter antennae and received at a plurality of receiver antennae, comprising:

demodulation circuitry, coupled to the receiver antennae, for demodulating the received signals into a plurality of frequency domain datastreams; and shared decoder logic circuitry, for first decoding the plurality of frequency domain datastreams to generate estimated signals transmitted from each of the transmitter antennae according to maximum-likelihood (ML) estimation, and for then Viterbi decoding at least a portion of the estimated transmitted signals according to an error correction code;

wherein at least some circuits of the shared decoder logic circuitry are used both in the decoding of the plurality of frequency domain datastreams to generate the estimated transmitted signals and in the decoding of those estimated transmitted signals according to the error correction code.

2. The system of claim 1, wherein the received signals are modulated over a plurality of subchannels;

and wherein the demodulation circuitry comprises circuitry for applying a Fast Fourier Transform to the received modulated signals.

3. The system of claim 1, wherein the received signals are arranged in frames, each frame having a control channel portion and a data channel portion;

and wherein the shared decoder logic circuitry is for decoding both the control channel portion and the data channel portion of each frame to generate the estimated transmitted signals, and for Viterbi decoding the control channel portion of each frame.

4. The system of claim 3, wherein the shared decoder logic circuitry is for Viterbi decoding the control channel portion of each frame according to a constraint K;

wherein the modulated signals received at a first receiver antenna are modulated according to an $N_1$-point constellation in the complex plane;

and wherein the constraint K is less than or equal to a value $K_{max}$ defined by:

$$N_1 = 2^{K_{max}-1}.$$

5. The system of claim 4, wherein the shared decoder logic circuitry is for Viterbi decoding the control channel portion of each frame, calculated at a radix R;

wherein the modulated signals received at a second receiver antenna are modulated according to an $N_2$-point constellation in the complex plane;

and wherein the radix R is less than or equal to a value $R_{max}$ defined as:

$$N_2 = 2^{R_{max}}.$$

6. The system of claim 3, further comprising:

second decoding logic, for decoding the data channel of each frame according to an error correction code.

7. The system of claim 6, wherein the second decoding logic decodes the data channel of each frame by turbo decoding.

8. The system of claim 6, wherein the second decoding logic decodes the data channel of each frame according to a low density parity check code.

9. A method of processing modulated communications signals, comprising the steps of:

receiving communication signals at a plurality of receiver antennae, the communication signals being modulated over a plurality of subchannels, and transmitted from a plurality of transmitter antennae;

demodulating the received signals into frequency-domain datastreams;

operating shared decoder logic circuitry upon the frequency-domain datastreams to recover estimates of the transmitted signals, using maximum-likelihood (ML) estimation; and operating the shared decoder logic circuitry to Viterbi decode at least a portion of the estimated transmitted signals, according to an error correction code.

10. The method of claim 9, wherein the demodulating step comprises:
applying a Fast Fourier Transform to the modulated received signals.

11. The method of claim 9, wherein the received signals are arranged in frames, each frame having a control channel portion and a data channel portion;
wherein the step of operating shared decoder circuitry to recover estimates of the transmitted signals is applied to both the control channel portion and the data channel portion of each frame;
and wherein the step of operating the shared decoder logic circuitry to Viterbi decode at least a portion of the estimated transmitted signals is applied to the control channel portion of each frame.

12. The method of claim 11, further comprising:
decoding the data channel portion of a frame using circuitry other than the shared decoder logic circuitry.

13. The method of claim 12, wherein the decoding step is performed by turbo decoding.

14. The system of claim 12, wherein the decoding step is performed according to a low density parity check code.

15. The method of claim 11, further comprising:
after the step of operating the shared decoder logic circuitry to Viterbi decode the control channel portion of a frame, interpreting the decoded control channel portion to determine whether the data channel portion of that frame contains payload data;
and wherein the step of decoding the data channel portion of the frame is performed responsive to the interpreting step determining that the data channel portion of that frame contains payload data.

16. The method of claim 11, wherein the shared decoder logic circuitry Viterbi decodes the control channel portion of each frame according to a constraint K;
wherein the modulated signals received at a first receiver antenna are modulated according to an $N_1$-point constellation in the complex plane;
and wherein the constraint K is less than or equal to a value $K_{max}$ defined by:

$$N_1 = 2^{K_{max}-1}.$$

17. The method of claim 11, wherein the shared decoder logic circuitry is for Viterbi decoding the control channel portion of each frame, calculated at a radix R;
wherein the modulated signals received at a second receiver antenna are modulated according to an $N_2$-point constellation in the complex plane;
and wherein the radix R is less than or equal to a value $R_{max}$ defined as:

$$N_2 = 2^{R_{max}}.$$

* * * * *